(12) United States Patent
Huang et al.

(10) Patent No.: US 10,327,353 B1
(45) Date of Patent: Jun. 18, 2019

(54) WIRE FIXING STRUCTURE

(71) Applicant: MOXA INC., New Taipei (TW)

(72) Inventors: Yi-Chiao Huang, New Taipei (TW); Chung-Kun Hou, New Taipei (TW)

(73) Assignee: MOXA INC., New Taipei (TW)

( * ) Notice: Subject to any disclaimer, the term of this patent is extended or adjusted under 35 U.S.C. 154(b) by 0 days.

(21) Appl. No.: 16/174,306

(22) Filed: Oct. 30, 2018

(51) Int. Cl.
*H05K 7/14* (2006.01)
*G06F 1/18* (2006.01)

(52) U.S. Cl.
CPC .......... *H05K 7/1491* (2013.01); *G06F 1/183* (2013.01)

(58) Field of Classification Search
CPC ............................. H05K 7/1491; G06F 1/183
USPC ........................................ 174/70 R
See application file for complete search history.

(56) References Cited

U.S. PATENT DOCUMENTS

| | | | | |
|---|---|---|---|---|
| 7,570,861 B2* | 8/2009 | Smrha | ................ | G02B 6/4452 385/135 |
| 7,873,253 B2* | 1/2011 | Smrha | ................ | G02B 6/4452 385/135 |
| 8,452,148 B2* | 5/2013 | Cooke | ................ | G02B 6/4452 385/135 |
| 9,816,304 B2* | 11/2017 | Wells | ................ | E05D 3/12 |
| 2015/0195945 A1* | 7/2015 | Anderson | ........... | G02B 6/4452 361/679.02 |

* cited by examiner

*Primary Examiner* — Andargie M Aychillhum
*Assistant Examiner* — Michael F McAllister
(74) *Attorney, Agent, or Firm* — Chih Feng Yeh; Huntington IP Consulting Co., Ltd.

(57) ABSTRACT

The wire fixing structure is provided. A fixing main plate, at least one wire fixing plate, and at least one wire fixing component are combined to fix partially an external wire when the external wire is inserted into a connector of a computer or a server, thereby providing the technical efficiency that the external wire inserted into the connector is partially fixed.

9 Claims, 12 Drawing Sheets

WIRE FIXING STRUCTURE

BACKGROUND OF THE RELATED ART

Technical Field

The invention relates to a wire fixing structure. In particular, the invention pertains to a wire fixing structure, which makes an external wire inserted into a connector of a computer or a server be partially fixed by the combination of a fixing main plate, at least one wire fixing plate, and at least one wire fixing component.

Related Art

The connector of the existing computer or server is to provide the insertion for the external wire to make the computer or the server connect with other devices. When the external wire is inserted into the connector of the computer or the server, only the connector of the computer or the server is designed to provide the external wire fixing.

However, there is only the connector of the computer or the server designed to provide the external wire inserting and fixing. When the external wire is pulled and dragged by strong external force, the external wire is often damaged, or even the connector of the computer or the server is damaged.

In summary, as can be known, the prior art has the problem that there is only the connector of the computer or the server designed to provide external wire inserting and fixing, which is likely to cause damage to the external wire or even the connector; therefore, it is necessary to propose an improved technical solution to resolve the problem.

SUMMARY

In view of the prior art, there is a problem that there is only the connector of the computer or the server designed to provide external wire inserting and fixing, which is likely to cause damage to the external wire or even the connector. The present invention discloses a wire fixing structure.

The wire fixing structure disclosed in the present invention is to make an external wire inserted into a connector of a computer or a server be partially fixed, and the wire fixing structure comprises a fixing main plate, at least one wire fixing plate and at least one wire fixing component.

The fixing main plate has an outer fixing part, a chute, a fixing groove and a hollow part, and the outer fixing part of the fixing main plate screws the fixing main plate to a casing of the computer or the server and a position of the fixing main plate corresponds to that of the connector of the computer or the server. A slide fixing part of the at least one wire fixing plate is disposed in the chute of the fixing main plate to make the at least one wire fixing plate slide to the position, which corresponds to the position of the connector of the computer or the server.

The at least one wire fixing plate has the slide fixing part, a plate fixing part and a hollow groove, and the plate fixing part of the at least one wire fixing plate, which coordinates with the slide fixing part of the at least one wire fixing plate, screws the at least one wire fixing plate to the fixing main plate, and makes the hollow groove of the at least one wire fixing plate disposed in the hollow part of the fixing main plate.

The at least one wire fixing component has a fastener fixing part and a wire fixing part. The fastener fixing part of the at least one wire fixing component is disposed in the hollow groove of the at least one wire fixing plate when the external wire is inserted into the connector of the computer or the server. The at least one wire fixing component moves relatively to the hollow groove of the at least one wire fixing plate to make a wire part of the external wire fixed by the fastener fixing part of the at least one wire fixing component. The fastener fixing part of the at least one wire fixing component screws the at least one wire fixing component to the at least one wire fixing plate, thereby fixing the wire part of the external wire when the external wire is inserted into the connector of the computer or the server.

There is the wire fixing structure as described above, wherein the slide fixing part of the at least one wire fixing plate is disposed by passing through assembly spaces at two ends of the chute, so that the at least one wire fixing plate slides to the position corresponding to the connector of the computer or the sever.

There is the wire fixing structure as described above, wherein the plate fixing part of the at least one wire fixing plate has an elastic element, when the fastener fixing part of the at least one wire fixing component screws the at least one wire fixing component to the at least one wire fixing plate, the elastic element of the plate fixing part resists the fastener fixing part of the at least one wire fixing component to provide the external wire with fixing force when the external wire is inserted into the connector of the computer or the server.

There is the wire fixing structure as described above, wherein the wire fixing part is further provided with an inner wiring fixing part, and the wire fixing part and the inner wiring fixing part partially fix the external wires with different outer diameters respectively.

There is the wire fixing structure as described above, wherein the fixing main plate has a plurality of structural strengthening parts.

There is the wire fixing structure as described above, wherein the slide fixing part and the main part form a stepped shape.

There is the wire fixing structure as described above, wherein the slide fixing part and the main part form a hook shape.

There is the wire fixing structure as described above, wherein a step difference between the slide fixing part and the main part is equal to a thickness of the fixing main plate.

There is the wire fixing structure as described above, wherein a groove width of the chute is equal to a thickness of the at least one wire fixing plate.

The wire fixing structure disclosed in the present invention is as described above, and the difference from the prior art is that the external wire inserted into the connector of the computer or the server is partially fixed by the combination of the fixing main plate, the at least one wire fixing plate, and the at least one wire fixing component.

By aforementioned technology means, the present invention can provide the technical efficiency that the external wire inserted into the connector is partially fixed.

BRIEF DESCRIPTION OF THE DRAWINGS

The invention will become more fully understood from the detailed description given herein below illustration only, and thus is not limitative of the present invention, and wherein.

DETAILED DESCRIPTION

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proparts and ratios of elements in the drawings may be exaggerated or diminished in size for the sake of clarity and convenience. Such arbitrary proparts are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present invention. As used herein, the term "or" includes any and all combinations of one or more of the associated listed items.

Figure 1A:
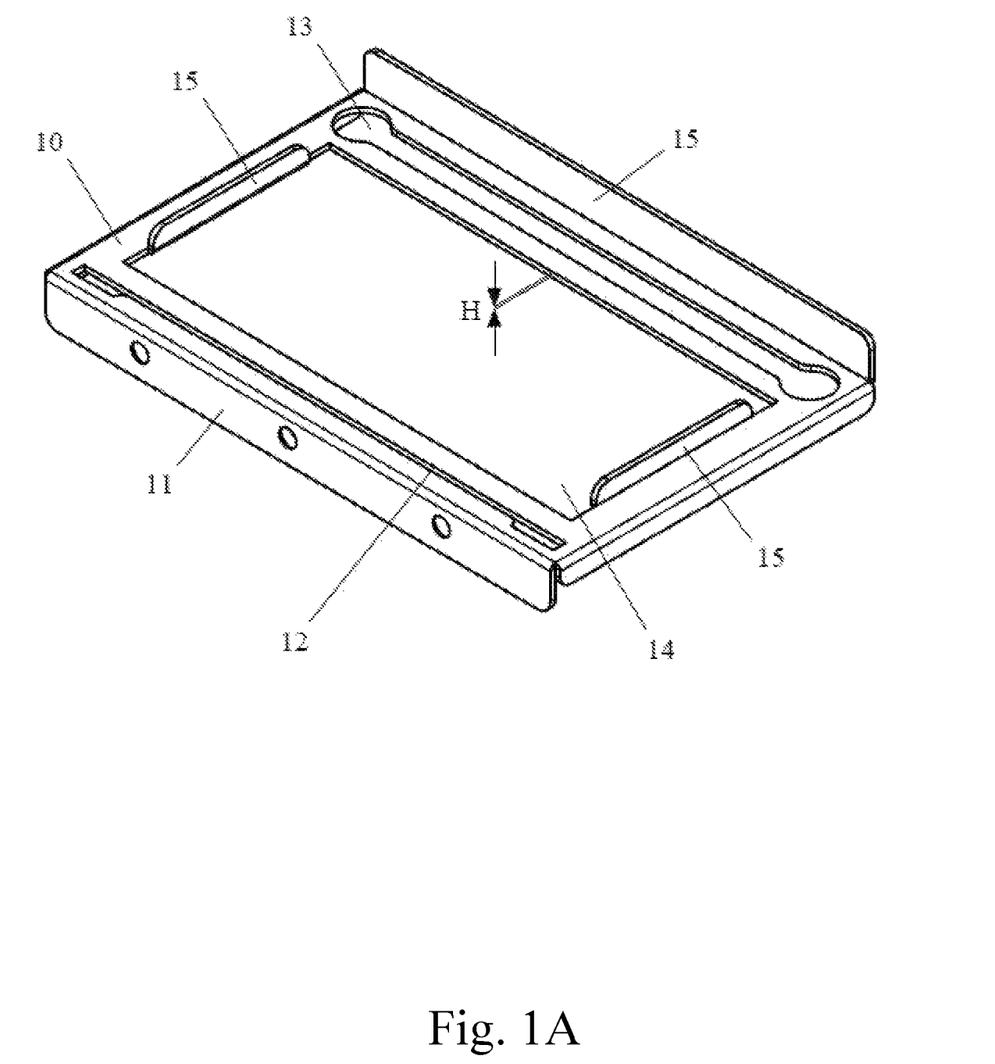
FIG. 1A is a three-dimensional view showing a fixing main plate of a wire fixing structure of the present invention.
Figure 1B:
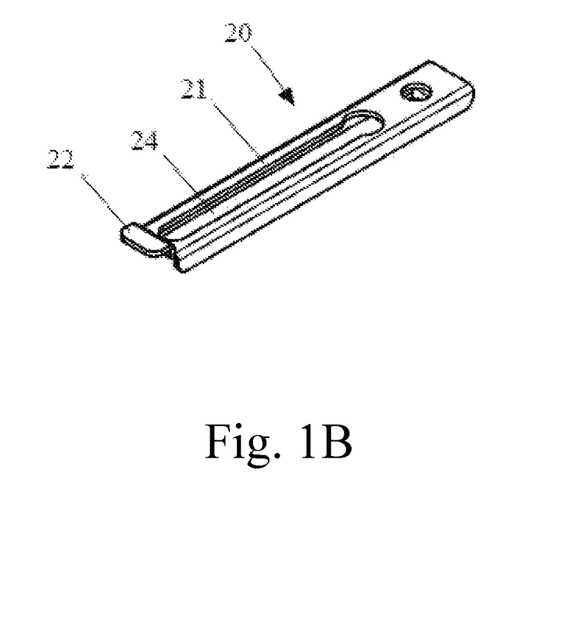
FIG. 1B is a three-dimensional view showing a wire fixing plate of the wire fixing structure of the present invention from a first perspective.
Figure 1C:
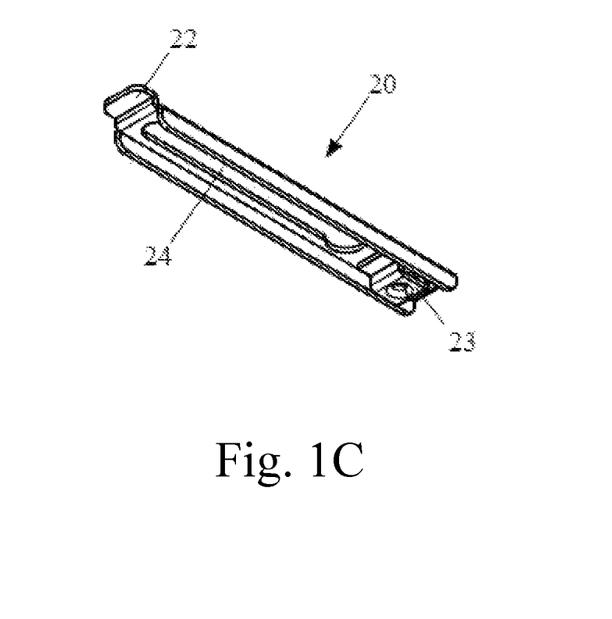
FIG. 1C is a three-dimensional view showing the wire fixing plate of the wire fixing structure of the present invention from a second perspective.
Figure 1D:
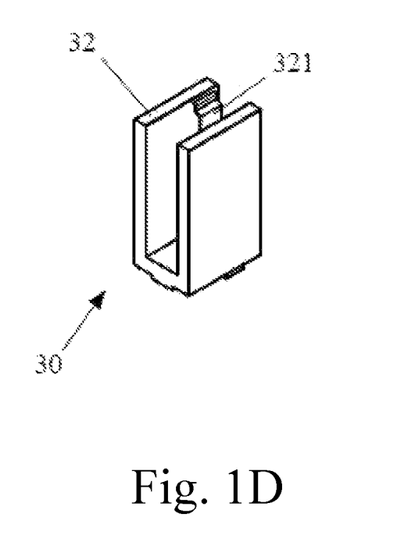
FIG. 1D is a three-dimensional view showing a wire fixing component of the wire fixing structure of the present invention from a first perspective.
Figure 1E:
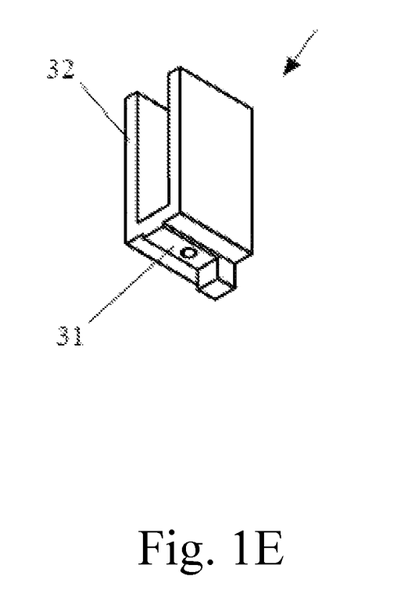
FIG. 1E is a three-dimensional view showing the wire fixing component of the wire fixing structure of the present invention from a second perspective.

The following is a description of a wire fixing structure disclosed in the present invention. Please refer to FIG. 1A to FIG. 1E, wherein FIG. 1A is a three dimensional view showing a fixing main plate of a wire fixing structure of the present invention; FIG. 1B is a three-dimensional view showing a wire fixing plate of the wire fixing structure of the present invention from a first perspective; FIG. 1C is a three-dimensional view showing the wire fixing plate of the wire fixing structure of the present invention from a second perspective; FIG. 1D is a three-dimensional view showing a wire fixing component of the wire fixing structure of the present invention from a first perspective; and FIG. 1E is a three-dimensional view showing the wire fixing component of the wire fixing structure of the present invention from a second perspective.

The wire fixing structure disclosed in the present invention comprises: a fixing main plate 10, at least one wire fixing plate 20, and at least one wire fixing component 30. The fixing main plate 10 has an outer fixing part 11, a chute 12, a fixing groove 13, and a hollow part 14. The wire fixing plate 20 has a main part 21, a slide fixing part 22, a plate fixing part 23, and a hollow groove 24. The wire fixing component 30 has a fastener fixing part 31 and a wire fixing part 32.

The fixing main plate 10 can be made of metal material or polymer material, wherein the metal material is, for example, iron, aluminum, alloy, etc., and the polymer material is a thermosetting polymer or a thermoplastic polymer, which are merely exemplified herein and are not intended to limit the scope of application of the invention.

As shown in FIG. 1A, the fixing main plate 10 further has a plurality of structural strengthening parts 15, and the structural strengthening parts 15 of the fixing main plate 10 are to provide structural strength of the fixing main plate 10 to avoid the problem that the fixing main plate 10 is easily deformed because of the hollow part 14 of the fixing main plate 10.

Figure 2A:
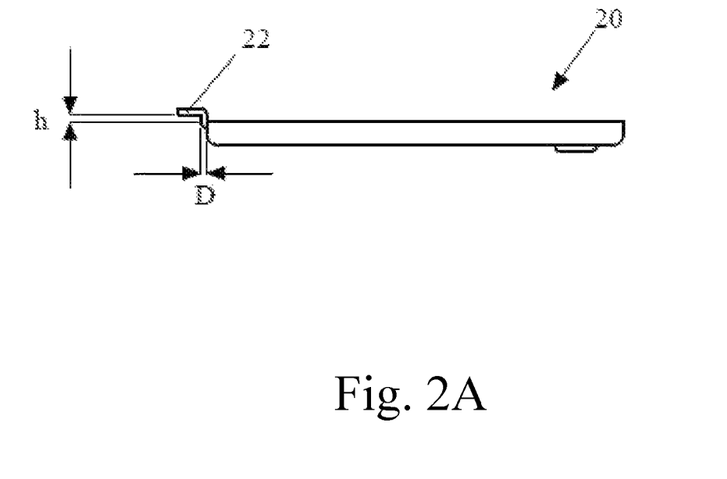
FIG. 2A is a side view showing the first embodiment of the wire fixing plate of the wire fixing structure of the present invention.
Figure 2B:
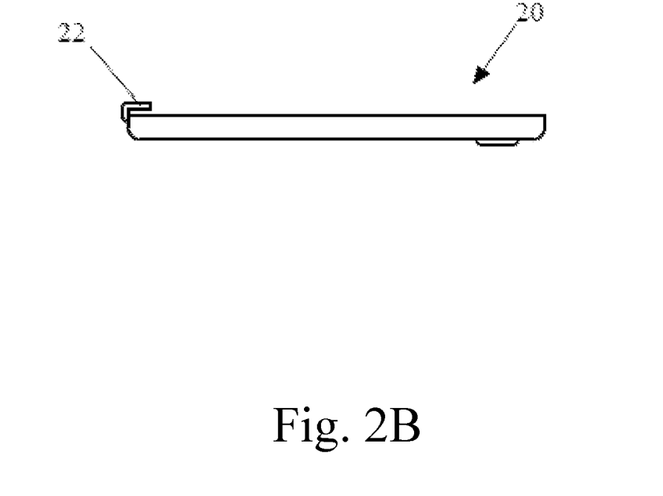
FIG. 2B is a side view showing a second embodiment of the wire fixing plate of the wire fixing structure of the present invention.

Please refer to FIG. 1B, FIG. 2A and FIG. 2B simultaneously, wherein FIG. 2A is a side view showing the first embodiment of the wire fixing plate of the wire fixing structure of the present invention; and FIG. 2B is a side view showing a second embodiment of the wire fixing plate of the wire fixing structure of the present invention.

In the FIG. 1B and FIG. 2A, the slide fixing part 22 of the wire fixing plate 20 and the main part 21 of the wire fixing plate 20 form a stepped shape, which is merely exemplified herein and is not intended to limit the scope of application of the invention. The slide fixing part 22 of the wire fixing plate 20 provides a part of the utility of fixing the wire fixing plate 20 to the fixing main plate 10.

The wire fixing plate 20 may be made of metal material or polymer material, wherein the metal material is, for example, iron, aluminum, alloy, etc., and the polymer material is a thermosetting polymer or a thermoplastic polymer, which are merely exemplified herein and are not intended to limit the scope of application of the invention.

In the FIG. 2B, the slide fixing part 22 of the wire fixing plate 20 and the main part 21 of the wire fixing plate 20 form a stepped shape, which is merely exemplified herein and is not intended to limit the scope of application of the invention. The slide fixing part 22 of the wire fixing plate 20 provides a part of the utility of fixing the wire fixing plate 20 to the fixing main plate 10.

It is to be noted that there is a step difference h between the slide fixing part 22 of the wire fixing plate 20 and the main part 21 of the wire fixing plate 20, and the step difference h is equal to the thickness H of the fixing main plate 10. That is, when the wire fixing plate 20 is fixed to the fixing main plate 10, the slide fixing part 22 of the wire fixing plate 20 can be attached to the wire fixing plate 20 and provide a part of the utility of fixing the wire fixing plate 20 to the fixing main plate 10.

Figure 3A:
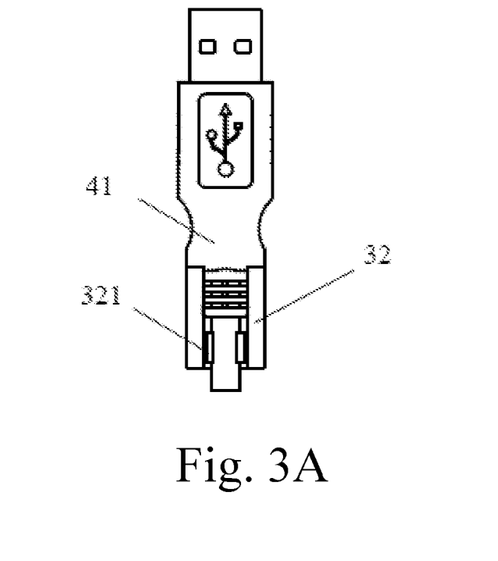
FIG. 3A is a plan view showing the wire fixing component of the wire fixing structure of the present invention in the usage state.
Figure 3B:
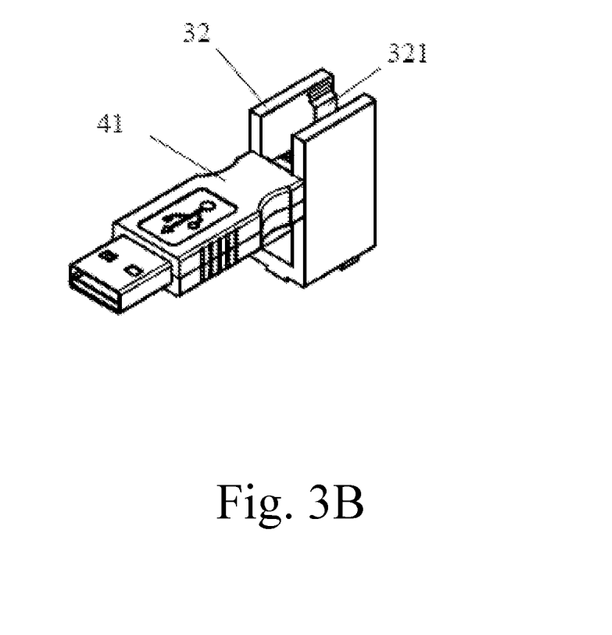
FIG. 3B is a three-dimensional view showing the wire fixing component of the wire fixing structure of the present invention in the usage state.

Please refer to FIG. 1D, FIG. 1E, FIG. 3A and FIG. 3B, wherein FIG. 3A is a plan view showing the wire fixing component of the wire fixing structure of the present invention in the usage state; and FIG. 3B is a three-dimensional view showing the wire fixing component of the wire fixing structure of the present invention in the usage state.

The wire fixing part 32 of the wire fixing component 30 is further provided with an inner wiring fixing part 321, and the wire fixing part 32 of the wire fixing component 30 and the inner wiring fixing part 321 of the wire fixing component 30 partially fix the external wires 41 with different outer diameters respectively as shown in FIG. 3B.

The wire fixing component 30 may be made of a metal material or a polymer material, wherein the metal material is, for example, iron, aluminum, alloy, etc., and the polymer material is a thermosetting polymer or a thermoplastic polymer, which are merely exemplified herein and are not intended to limit the scope of application of the invention.

Figure 4A:
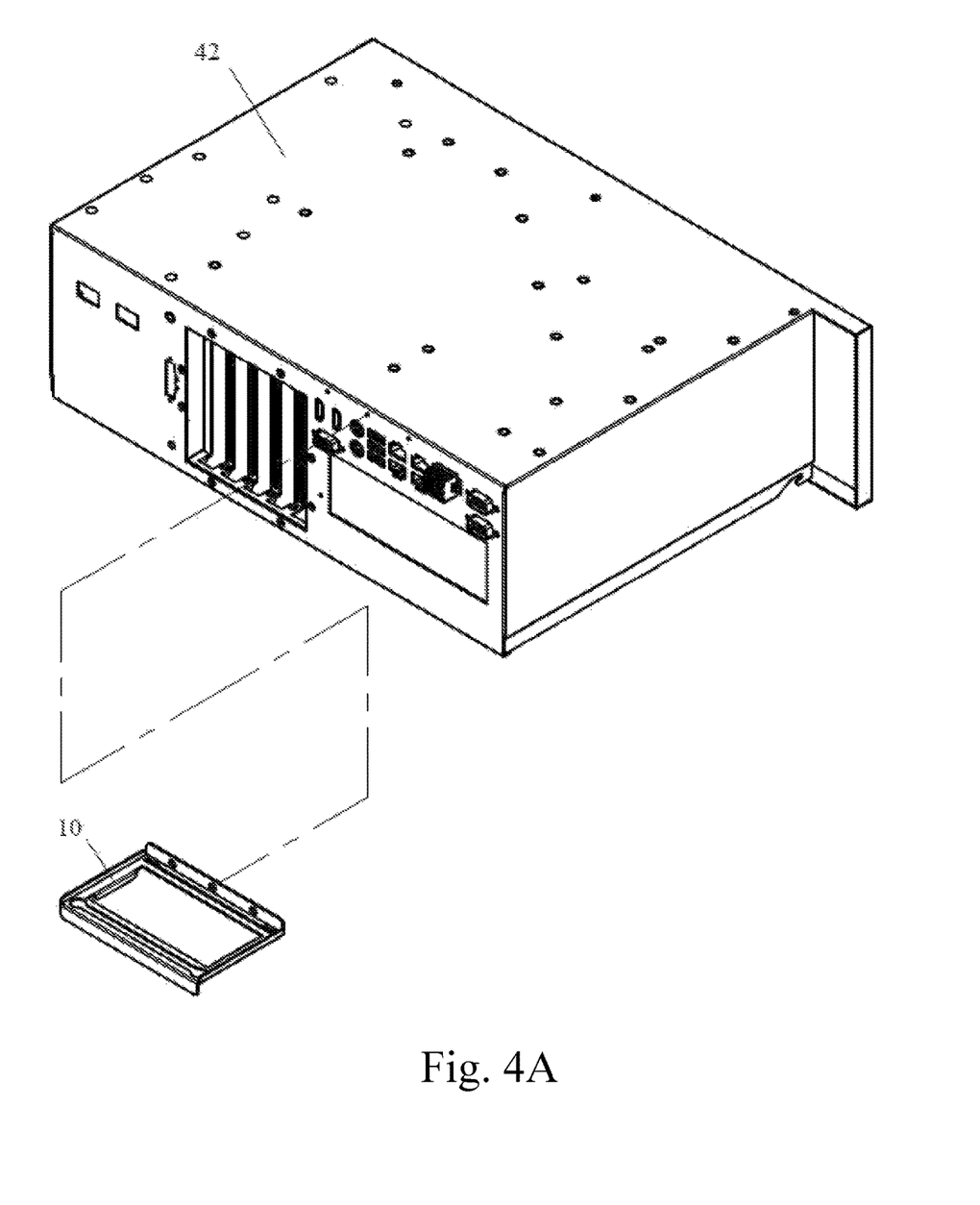
FIG. 4A is a three-dimensional view of separating the fixing main plate of the wire fixing structure of the present invention and the computer or the server in the assembly process.
Figure 4B:
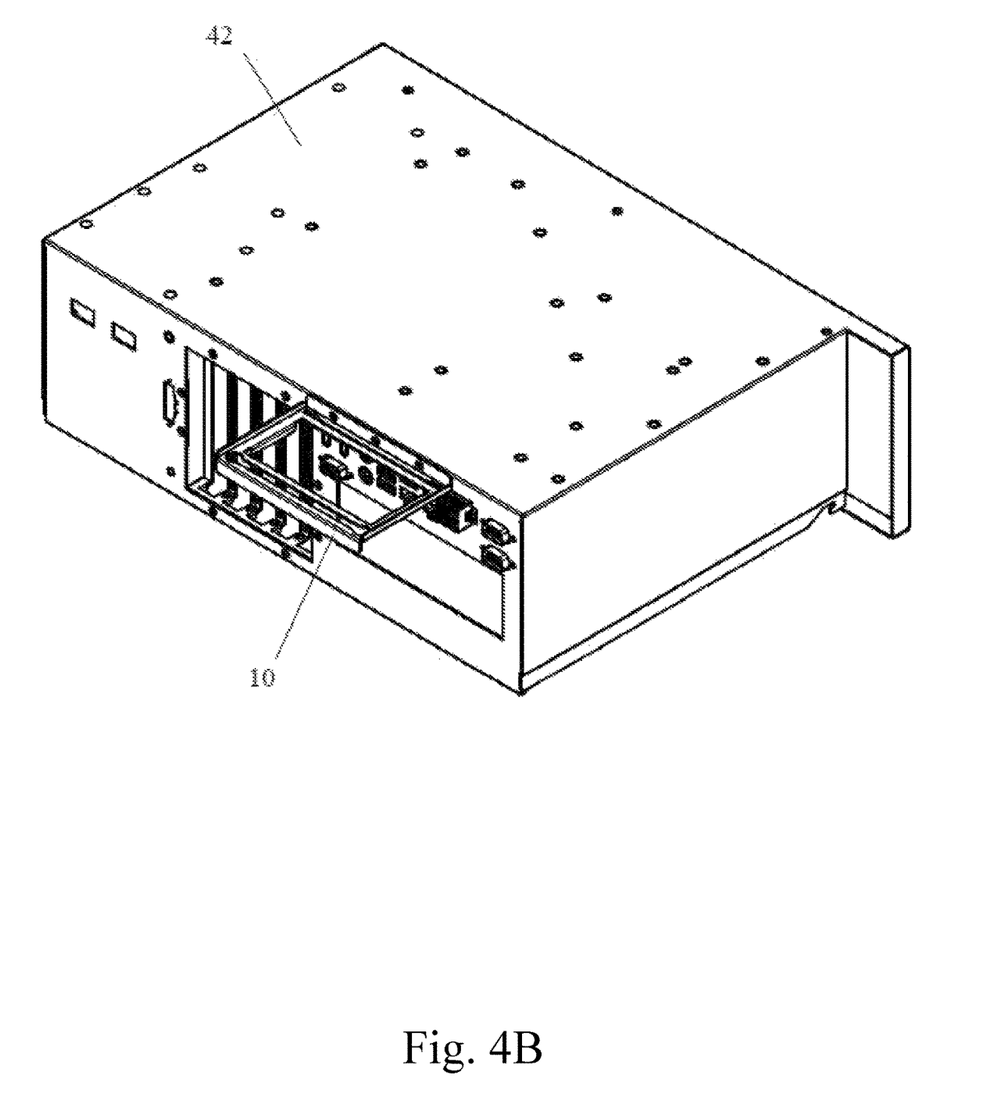
FIG. 4B is a three-dimensional view of assembling the fixing main plate of the wire fixing structure of the present invention and the computer or the server in the assembly process.

Please refer to FIG. 4A and FIG. 4B, wherein FIG. 4A is a three-dimensional view of separating the fixing main plate of the wire fixing structure of the present invention and the computer or the server in the assembly process; and FIG. 4B is a three-dimensional view of assembling the fixing main plate of the wire fixing structure of the present invention and the computer or the server in the assembly process.

The outer fixing part 11 of the fixing main plate 10 screws the fixing main plate 10 to the casing 42 of the computer or the server and the position of the fixing main plate 10 corresponds to the position of the connector 42 of the computer or the server. That is, the screwed positions of the fixing main plate 10 and the casing 42 of the computer or the server are mutually engaged, so that the setting range of the fixing main plate 10 can include the connector 42 of the computer or the server when the fixing main plate 10 is screwed to the casing 42 of the computer or the server.

Figure 5A:
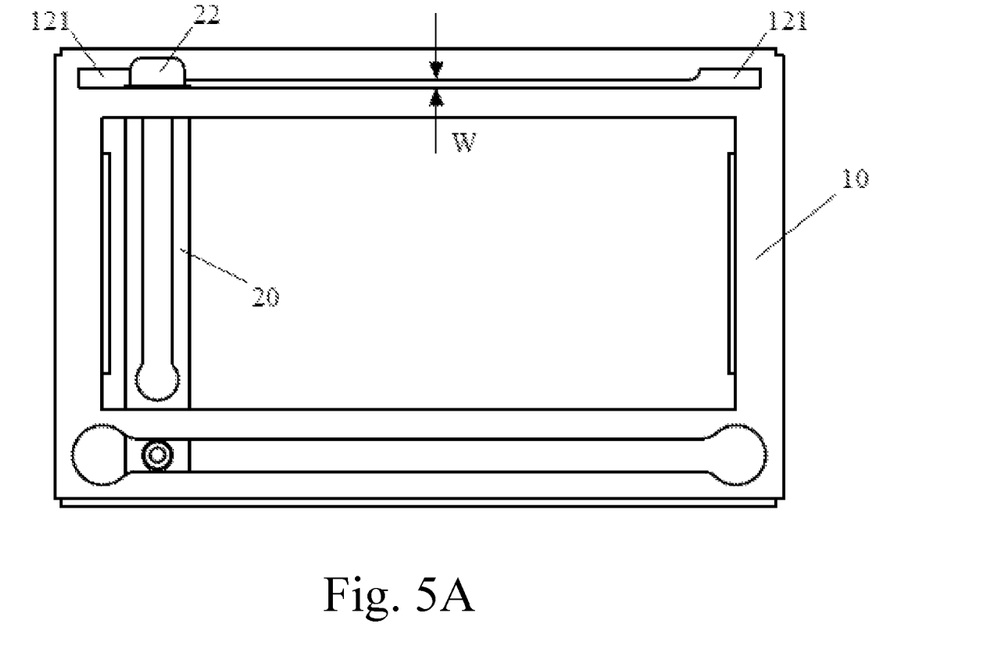
FIG. 5A and FIG. 5B are plan views showing the fixing main plate and the wire fixing plate of the wire fixing structure of the present invention in the assembly process.
Figure 5B:
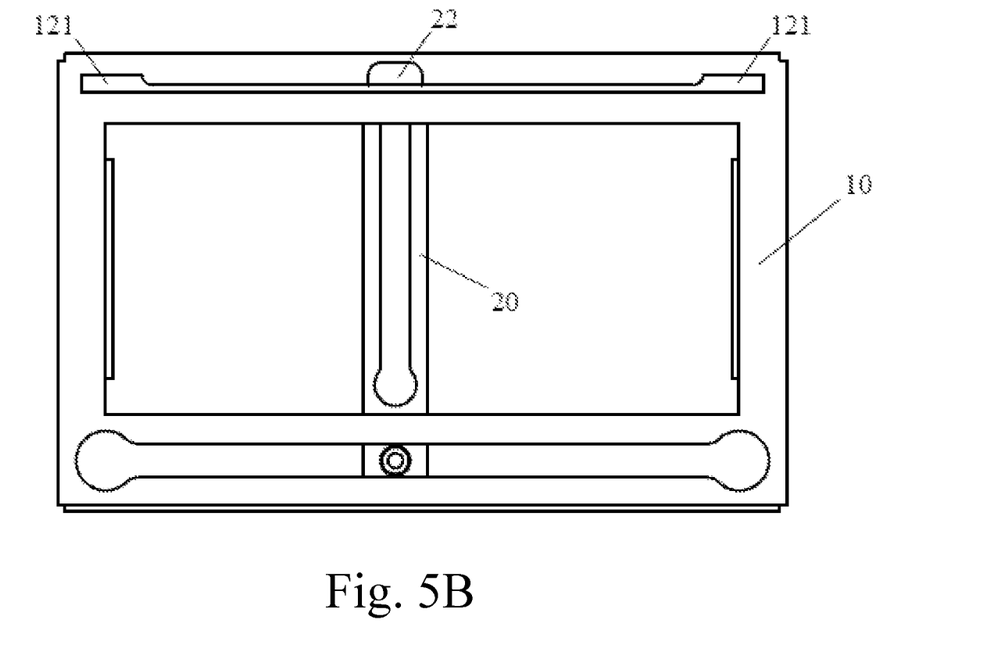
Figure 5C:
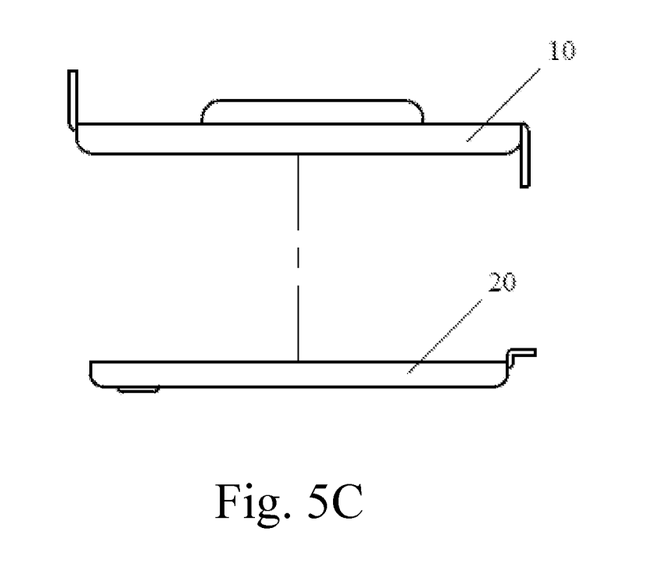
FIG. 5C and FIG. 5D are side views showing the fixing main plate and the wire fixing plate of the wire fixing structure of the present invention in the assembly process.
Figure 5D:
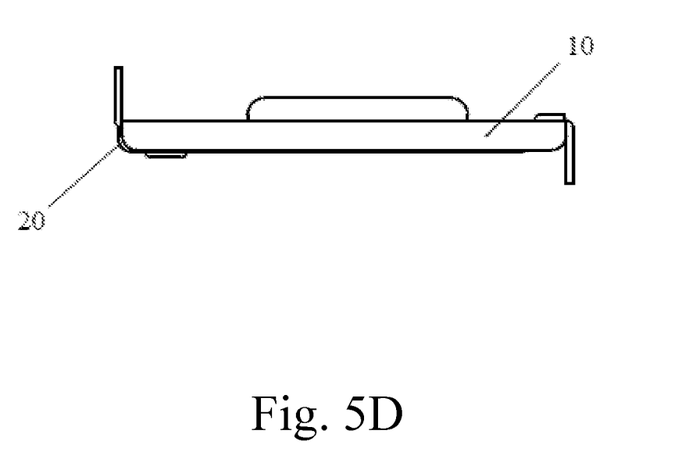

Please refer to FIG. 5A to FIG. 5D, wherein FIG. 5A and FIG. 5B are plan views showing the fixing main plate and the wire fixing plate of the wire fixing structure of the present invention in the assembly process; and FIG. 5C and FIG. 5D are side views showing the fixing main plate and the wire fixing plate of the wire fixing structure of the present invention in the assembly process.

The two ends of the chute 12 of the fixing main plate 10 have an assembly space 121 respectively, and the slide fixing part 22 of the wire fixing plate 20 passes through one of the assembly spaces 121 of the two ends of the chute 12 to make the slide fixing part 22 of the wire fixing plate 20 attached to the fixing main plate 10. After the wire fixing plate 20 moves to position along the chute 12 of the fixing main plate 10, the plate fixing part 23 of the wire fixing plate 20 and the fixing groove 13 of the fixing main plate 10 are fixed to each other in a screwing manner, thereby assembling the wire fixing plate 20 to the fixing main plate 10. It is noted that when the wire fixing plate 20 is assembled to the fixing main plate 10, the hollow groove 24 of the wire fixing plate 20 is disposed in the hollow part 14 of the fixed main plate 10, and the groove width W of the chute 12 of the fixing main plate 10 is equal to the thickness D of the wire fixing plate 20.

Figure 6A:
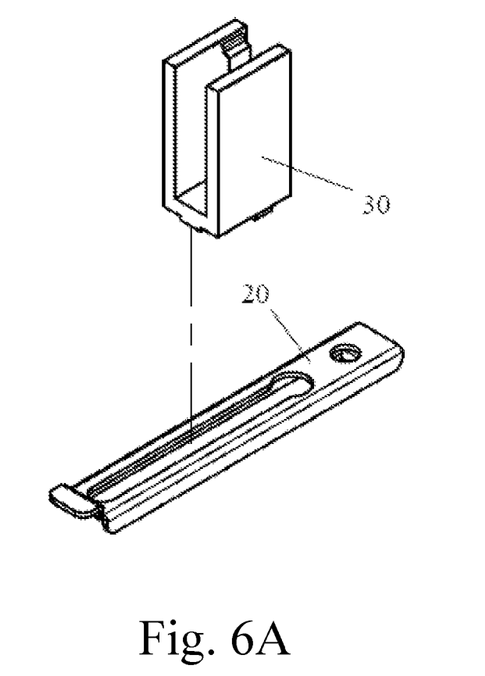
FIG. 6A is a three-dimensional view of separating the wire fixing plate and the wire fixing component of the wire fixing structure of the present invention.
Figure 6B:
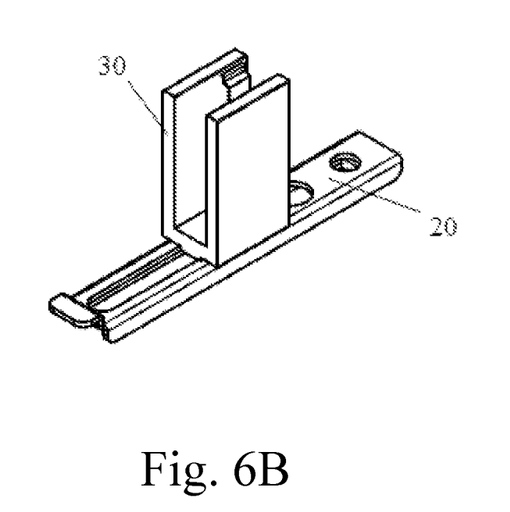
FIG. 6B is a three-dimensional view of assembling the wire fixing plate and the wire fixing component of the wire fixing structure of the present invention.

Please refer to FIG. 6A to FIG. 6B, wherein FIG. 6A is a three-dimensional view of separating the wire fixing plate and the wire fixing component of the wire fixing structure of the present invention; and FIG. 6B is a three-dimensional view of assembling the wire fixing plate and the wire fixing component of the wire fixing structure of the present invention.

The fastener fixing part 31 of the wire fixing component 30 is disposed in the hollow groove 24 of the wire fixing plate 20. After the wire fixing component 30 moves to position along the hollow groove 24 of the wire fixing plate 20, the fastener fixing part 31 of the wire fixing component 30 and the hollow groove 24 of the wire fixing plate 20 are fixed to each other by screwing, thereby assembling the wire fixing component 30 to the wire fixing plate 20.

Figure 7:
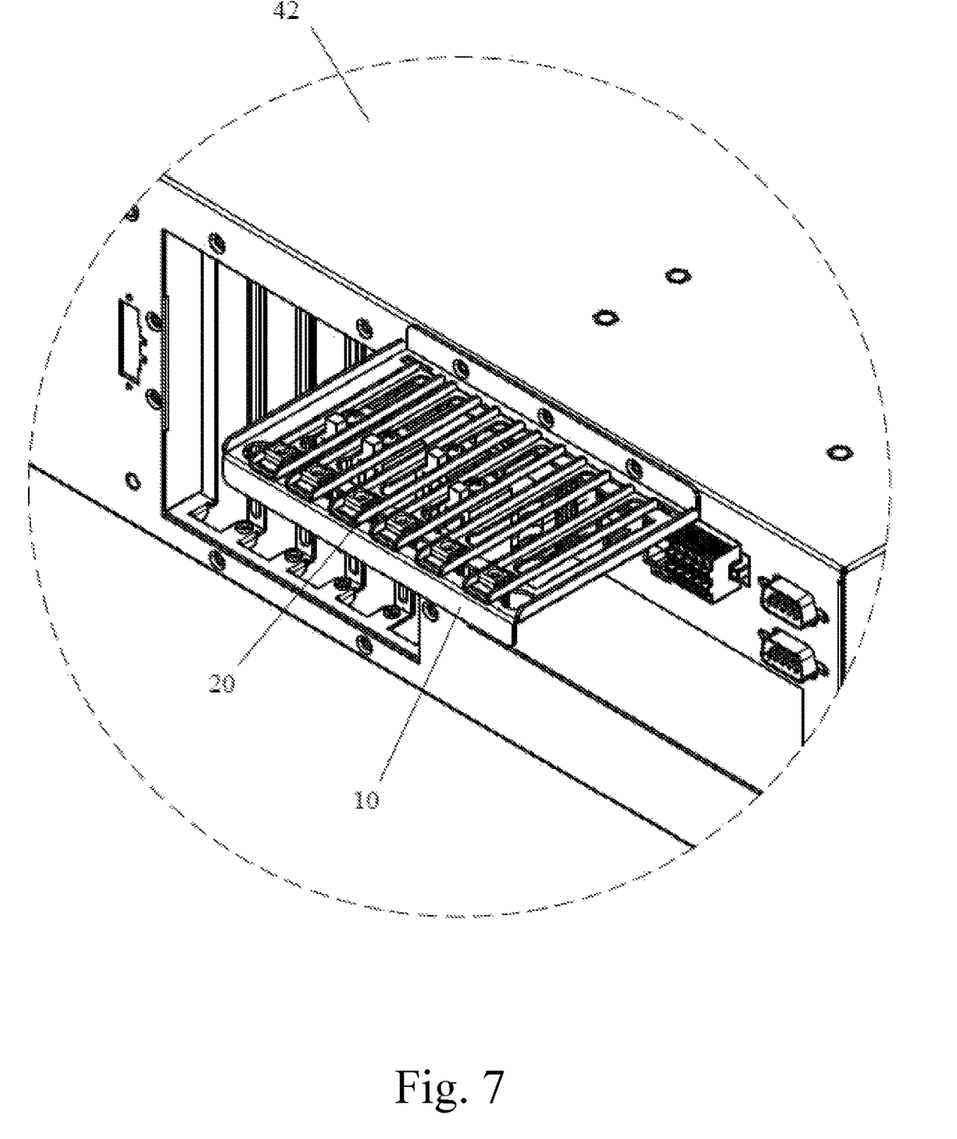
FIG. 7 is a three-dimensional enlarged view showing a part of the wire fixing structure of the present invention in the usage state.

Please refer to FIG. 7, where FIG. 7 is a three-dimensional enlarged view showing a part of the wire fixing structure of the present invention in the usage state.

The outer fixing part 11 of the fixing main plate 10 fixes the fixing main plate 10 to the casing 42 of the computer or the server in a screwing manner and the position of the fixing main plate 10 corresponds to the position of the connector of the computer or the server. The slide fixing part 22 of the wire fixing plate 20 is disposed in the chute 12 of the fixing main plate 10 and makes the wire fixing plate 20 slide to the position, which corresponds to the position of the connector of the computer or the server. The plate fixing part 23 of the wire fixing plate 20, which coordinates with the slide fixing part 22 of the wire fixing plate 20, screws the wire fixing plate 20 to the fixing main plate 10, and make the hollow groove 24 of the wire fixing plate 20 disposed in the hollow part 14 of the fixing main plate 10. When the external wire 41 is inserted into the connector of the computer or the server, the fastener fixing part 31 of the wire fixing component 30 is disposed in the hollow groove 24 of the wire fixing plate 20, and the wire fixing component 30 moves relatively to the hollow groove 24 of the wire fixing plate 20 to make the wire part of the external wire 41 fixed by the wire fixing part 32 of the wire fixing component 30, and the fastener fixing part 31 of the wire fixing component 30 fixes the wire fixing component 30 to the wire fixing plate 20 by screwing, thereby partially fixing the external wire inserted into the connector of the computer or the server.

Figure 8:
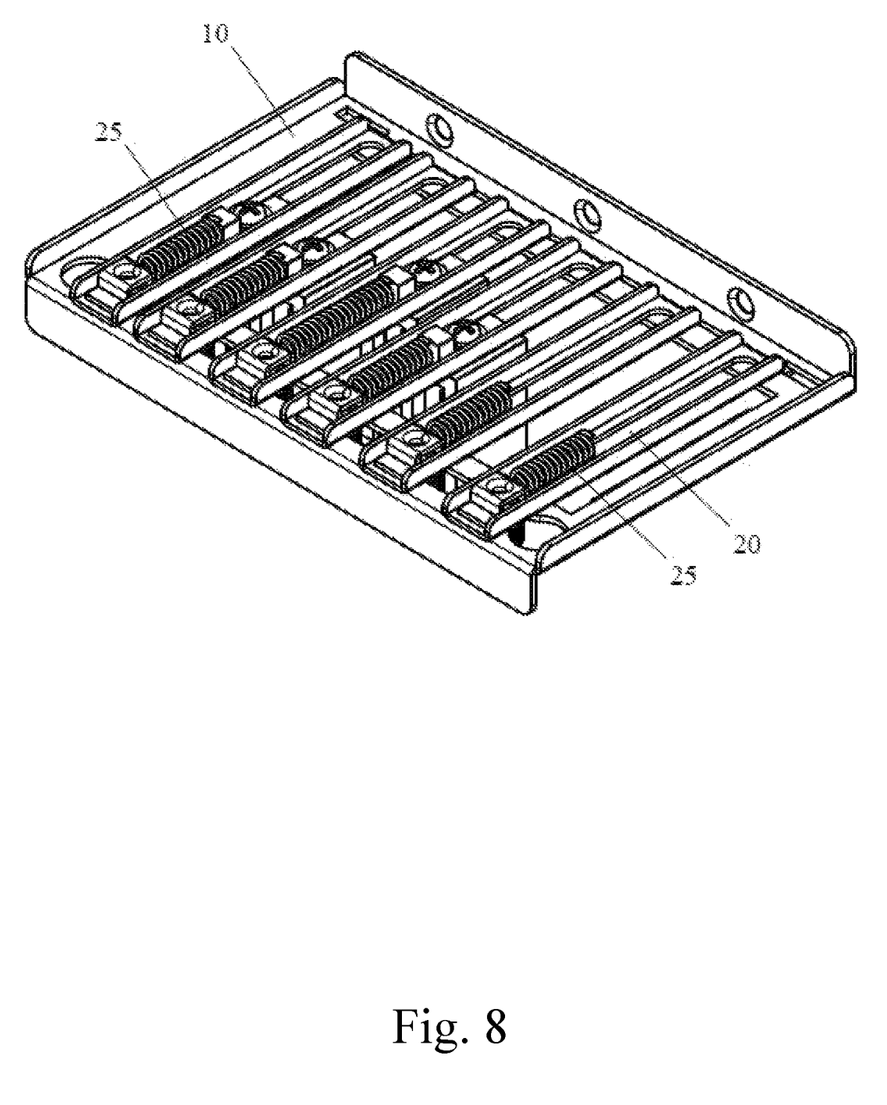
FIG. 8 is a three-dimensional view showing an elastic element of the wire fixing structure of the present invention in the usage state.

Please refer to FIG. 8, where FIG. 8 is a three-dimensional view showing an elastic element of the wire fixing structure of the present invention in the usage state. The plate fixing part 23 of the wire fixing plate 20 is further provided with the elastic element 25. When the fastener fixing part 31 of the wire fixing component 30 screws the wire fixing component 30 to the wire fixing plate 20, the elastic element 25 of the plate fixing part 23 resists the fastener fixing part 31 of the at least one wire fixing component 30 to provide the external wire 41 with fixing force when the external wire 41 is inserted into the connector of the computer or the server.

In summary, it can be seen that the difference between the present invention and the prior art is that the external wire inserted into the connector of the computer or the server is partially fixed by the combination of the fixing main plate, the at least one wire fixing plate, and the at least one wire fixing component.

By aforementioned technology means, the problem of the prior art that there is only the connector of the computer or the server designed to provide external wire inserting and fixing, which is likely to cause damage to the external wire or even the connector, can be solved, thereby providing the technical efficiency that the external wire inserted into the connector is partially fixed.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A wire fixing structure, configured to makes an external wire inserted into a connector of a computer or a server be partially fixed, the wire fixing structure comprising:
    a fixing main plate, having an outer fixing part, a chute, a fixing groove, and a hollow part, wherein the outer fixing part of the fixing main plate screws the fixing main plate to a casing of the computer or the server, and a position of the fixing main plate corresponds to that of the connector of the computer or the server;
    at least one wire fixing plate, having a main part, a slide fixing part, a plate fixing part, and a hollow groove, wherein the slide fixing part of the at least one wire fixing plate is disposed in the chute of the fixing main plate to make the at least one wire fixing plate slide to the position, which corresponds to the position of the connector of the computer or the server, and the plate fixing part of the at least one wire fixing plate, which coordinates with the slide fixing part of the at least one wire fixing plate, screws the at least one wire fixing plate to the fixing main plate, and makes the hollow groove of the at least one wire fixing plate disposed in the hollow part of the fixing main plate; and
    at least one wire fixing component, having a fastener fixing part and a wire fixing part, wherein the fastener fixing part of the at least one wire fixing component is disposed in the hollow groove of the at least one wire fixing plate when the external wire is inserted into the connector of the computer or the server, and the at least one wire fixing component moves relatively to the hollow groove of the at least one wire fixing plate to make a wire part of the external wire fixed by the fastener fixing part of the at least one wire fixing component, and the fastener fixing part of the at least one wire fixing component screws the at least one wire fixing component to the at least one wire fixing plate, thereby fixing the wire part of the external wire when the external wire is inserted into the connector of the computer or the server.

2. The wire fixing structure according to claim 1, wherein the slide fixing part of the at least one wire fixing plate is disposed by passing through assembly spaces at two ends of the chute, so that the at least one wire fixing plate slides to the position corresponding to the connector of the computer or the sever.

3. The wire fixing structure according to claim 1, wherein the plate fixing part of the at least one wire fixing plate has an elastic element, when the fastener fixing part of the at least one wire fixing component screws the at least one wire fixing component to the at least one wire fixing plate, the elastic element of the plate fixing part resists the fastener fixing part of the at least one wire fixing component to provide the external wire with fixing force when the external wire is inserted into the connector of the computer or the server.

4. The wire fixing structure according to claim 1, wherein the wire fixing part is further provided with an inner wiring fixing part, and the wire fixing part and the inner wiring fixing part partially fix the external wires with different outer diameters respectively.

5. The wire fixing structure according to claim 1, wherein the fixing main plate has a plurality of structural strengthening parts.

6. The wire fixing structure according to claim 1, wherein the slide fixing part and the main part form a stepped shape.

7. The wire fixing structure according to claim 1, wherein the slide fixing part and the main part form a hook shape.

8. The wire fixing structure according to claim 1, wherein a step difference between the slide fixing part and the main part is equal to a thickness of the fixing main plate.

9. The wire fixing structure according to claim 1, wherein a groove width of the chute is equal to a thickness of the at least one wire fixing plate.

* * * * *